United States Patent
Bi et al.

(10) Patent No.: US 11,060,842 B1
(45) Date of Patent: Jul. 13, 2021

(54) METHOD AND SYSTEM FOR DETECTING ABSOLUTE ELECTRICAL ANGLE, AND COMPUTER READABLE STORAGE MEDIUM

(71) Applicant: FORTIOR TECHNOLOGY (SHENZHEN) CO., LTD., Shenzhen (CN)

(72) Inventors: Chao Bi, Shenzhen (CN); Lei Bi, Shenzhen (CN)

(73) Assignee: FORTIOR TECHNOLOGY (SHENZHEN) CO., LTD., Shenzhen (CN)

( * ) Notice: Subject to any disclaimer, the term of this patent is extended or adjusted under 35 U.S.C. 154(b) by 36 days.

(21) Appl. No.: 16/795,013

(22) Filed: Feb. 19, 2020

(30) Foreign Application Priority Data

Dec. 23, 2019 (CN) .......................... 201911338800.3

(51) Int. Cl.
*G01R 33/07* (2006.01)
*G01B 7/30* (2006.01)
(Continued)

(52) U.S. Cl.
CPC .............. *G01B 7/30* (2013.01); *G01R 33/07* (2013.01); *G01R 33/09* (2013.01); *F16C 41/007* (2013.01); *G01D 5/145* (2013.01)

(58) Field of Classification Search
CPC .......... G01R 33/07; G01R 33/09; G01B 7/30; G01D 5/145; F16C 41/007
See application file for complete search history.

(56) References Cited

U.S. PATENT DOCUMENTS

| | | | | |
|---|---|---|---|---|
| 5,399,967 A | * | 3/1995 | Carscadden | G01D 5/145 324/207.12 |
| 6,707,293 B2 | * | 3/2004 | Wan | G01D 5/14 324/207.14 |

(Continued)

FOREIGN PATENT DOCUMENTS

| CN | 101398316 B | 9/2010 |
|---|---|---|
| CN | 103837169 A | 6/2014 |
| CN | 110133543 A | 8/2019 |

OTHER PUBLICATIONS

First Office Action in counterpart Chinese Application 201911338800.3, dated Feb. 21, 2020.

(Continued)

*Primary Examiner* — Alesa Allgood
(74) *Attorney, Agent, or Firm* — Westbridge IP LLC

(57) ABSTRACT

The present disclosure provides a method and a system for detecting an absolute electrical angle, and a computer readable storage medium. The method includes: obtaining an angle sine signal corresponding to a magnetic component in a first direction and an angle cosine signal corresponding to a magnetic component in a second direction; calculating a scaling compensation sine signal and a scaling compensation cosine signal according to the angle sine signal, the angle cosine signal, and a scaling compensation formula; determining an angle interval corresponding to the scaling compensation sine signal and the scaling compensation cosine signal, and calculating a relative electrical angle according to a preset trigonometric function corresponding to the angle interval; obtaining a Hall signal detected by the Hall sensor, and determining a polarity position according to the Hall signal; and calculating the absolute electrical angle according to the relative electrical angle and the polarity position.

10 Claims, 4 Drawing Sheets

(51) Int. Cl.
*G01R 33/09* (2006.01)
*F16C 41/00* (2006.01)
*G01D 5/14* (2006.01)

(56) References Cited

U.S. PATENT DOCUMENTS 9,606,189 B2 * 3/2017 Ausserlechner ....... G01R 33/07
2015/0346289 A1 * 12/2015 Ausserlechner ... G01R 33/0005
324/251

OTHER PUBLICATIONS

Zhang et al., An Online Step-by-step Correction Method for Sinusoidal Output Magnetic Encoders, Process Automation Instrumentation, Nov. 2014, pp. 9-12, vol. 35, No. 11, China.

* cited by examiner

METHOD AND SYSTEM FOR DETECTING ABSOLUTE ELECTRICAL ANGLE, AND COMPUTER READABLE STORAGE MEDIUM

CROSS-REFERENCE TO RELATED APPLICATION

The present disclosure claims the benefits and priority to Chinese Patent Application No. 201911338800.3, filed on Dec. 23, 2019, the entire disclosure of which is hereby incorporated by reference, in its entirety, for all that it teaches and for all purposes.

TECHNICAL FIELD

The present disclosure relates to the technical field of electromagnetic structures and signal processing, and in particular, to a magnetic encoder, a method and a system for detecting an absolute electrical angle, and a computer readable storage medium.

BACKGROUND

Nowadays, the magnetic encoder that detects an angular position using magnetoresistive (MR) sensor chips and anisotropic magnetoresistive (AMR) sensor chips has been used in a variety of control systems. This type of magnetic encoder detects the magnetic field component of the measured rotating magnetic field in a tangential-axial plane, or a tangential-radial plane, or a radial-axial plane, and outputs a voltage signal. However, since MR and AMR magnetoresistive sensors are only sensitive to the magnitude of the magnetic field, and are not sensitive to the polarity of the magnetic field, when the magnetic field of the measured magnetic steel rotates 360° electrical angle, that is, when the magnetic field changes for one cycle, the output signal of the magnetoresistive sensor changes for two cycles. Therefore, the signal of the magnetoresistive sensor is not the absolute electrical angle signal of the measured magnetic field, that is, the existing magnetic encoder cannot measure the absolute electrical angle of the measured magnetic steel.

SUMMARY

The main objective of the present disclosure is to provide a magnetic encoder, a method and a system for detecting an absolute electrical angle, and a computer readable storage medium, which aims to solve the problem that the existing magnetic encoder cannot accurately measure the absolute electrical angle of the measured magnetic steel.

In order to achieve the above objective, the present disclosure provides a method for detecting an absolute electrical angle of a magnetic encoder. The magnetic encoder includes a magnetoresistive sensor for detecting a magnetic component in a first direction, and a Hall sensor for detecting a magnetic component in a second direction and a polarity position; or the magnetic encoder includes a magnetoresistive sensor for detecting a magnetic component in a first direction and a magnetic component in a second direction and a Hall sensor for detecting a polarity position. A direction of the magnetic component in the first direction is perpendicular to a direction of the magnetic component in the second direction. The method for detecting the absolute electrical angle includes:

obtaining an angle sine signal corresponding to the magnetic component in the first direction and an angle cosine signal corresponding to the magnetic component in the second direction;

calculating a scaling compensation sine signal and a scaling compensation cosine signal according to the angle sine signal, the angle cosine signal, and a scaling compensation formula;

determining an angle interval corresponding to the scaling compensation sine signal and the scaling compensation cosine signal, and calculating a relative electrical angle of a measured magnetic steel according to a preset trigonometric function corresponding to the angle interval;

obtaining a Hall signal detected by the Hall sensor, and determining a polarity position of the magnetic encoder according to the Hall signal;

calculating the absolute electrical angle according to the relative electrical angle and the polarity position; and the scaling compensation formula is:

$$\begin{cases} V_{sc}(\theta) = [V_s(\theta) - V_{s0}]/V_{s1} \\ V_{cc}(\theta) = [V_c(\theta) - V_{c0}]/V_{c1} \end{cases}, V_{sc}(\theta)$$

is the scaling compensation sine signal, $V_{cc}(\theta)$ is the scaling compensation cosine signal, $V_s(\theta)$ is the angle sine signal, $V_c(\theta)$ is the angle cosine signal, $V_{s0}$ is a bias error of a preset sine signal, $V_{c0}$ is a bias error of a preset cosine signal, $V_{s1}$ is a harmonic amplitude compensation of the preset sine signal, $V_{c1}$ is a harmonic amplitude compensation of the preset cosine signal.

Optionally, the operation of "obtaining an angle sine signal corresponding to the magnetic component in the first direction and an angle cosine signal corresponding to the magnetic component in the second direction" includes:

obtaining a periodic voltage signal after the measured magnetic steel rotates for one cycle, the periodic voltage signal including a pre-scaling sine signal corresponding to the magnetic component in the first direction and a predetermined scale cosine signal corresponding to the magnetic component in the second direction;

substituting the periodic voltage signal into an offset error calculation formula and a harmonic amplitude compensation calculation formula to obtain an offset voltage and a harmonic amplitude compensation of the voltage signal;

the offset error calculation formula is:

$$V_{s0} = \frac{1}{2N\pi} \int_0^{2N\pi} V_s(\theta)\,d\theta$$

$$V_{c0} = \frac{1}{2N\pi} \int_0^{2N\pi} V_c(\theta)\,d\theta,$$

the harmonic amplitude compensation calculation formula is:

$$V_{sn} = \frac{1}{N\pi} \int_0^{2N\pi} V_s(\theta) \cdot \operatorname{Sin}(n\theta)\,d\theta$$

$$V_{cn} = \frac{1}{N\pi} \int_0^{2N\pi} V_c(\theta) \cdot \operatorname{Cos}(n\theta)\,d\theta;$$

and

N is a number of cycles of the signal, n is $n^{th}$ harmonic, θ is the relative electrical angle of the measured magnetic steel, Vo is the bias error of the preset sine signal, $V_{c0}$ is the bias error of the preset cosine signal, $V_s(\theta)$ is a pre-scaling sine signal of the periodic voltage signal, $V_c(\theta)$ is a scaling cosine signal of the periodic voltage signal, $V_{sn}$ is a harmonic amplitude compensation of $n^{th}$ preset sine signal, and $V_{cn}$ is a harmonic amplitude compensation of $n^{th}$ preset cosine signal.

Optionally, the operation of "determining an angle interval corresponding to the scaling compensation sine signal and the scaling compensation cosine signal, and calculating a relative electrical angle of a measured magnetic steel according to a preset trigonometric function corresponding to the angle interval" includes:

determining whether an angle corresponding to the scaling compensation sine signal and the scaling compensation cosine signal is within a preset angle interval, and the preset angle interval is −45° to 45° or 135° to 225°;

if the angle corresponding to the scaling compensation sine signal and the scaling compensation cosine signal is within the preset angle interval, calculating the relative electrical angle of the measured magnetic steel according to the following formula:

$$\theta = \text{Atan}\left[\frac{V_{sc}(\theta)}{V_{cc}(\theta)}\right];$$

if the angle corresponding to the scaling compensation sine signal and the scaling compensation cosine signal is not within the preset angle interval, calculating the relative electrical angle of the measured magnetic steel according to the following formula:

$$\theta = \text{Actan}\left[\frac{V_{cc}(\theta)}{V_{sc}(\theta)}\right];$$

and

θ is the relative electrical angle of the measured magnetic steel, $V_{sc}(\theta)$ is the scaling compensation sine signal, and $V_{cc}(\theta)$ is the scaling compensation cosine signal.

Optionally, the operation of "determining an angle interval corresponding to the scaling compensation sine signal and the scaling compensation cosine signal, and calculating a relative electrical angle of a measured magnetic steel according to a preset trigonometric function corresponding to the angle interval" includes:

determining the angle interval corresponding to the scaling compensation sine signal and the scaling compensation cosine signal;

if the angle interval corresponding to the scaling compensation sine signal and the scaling compensation cosine signal is (−45°, 45°], calculating an iterative electrical angle of the measured magnetic steel according to the following formula:

$$\theta_{n+1} = \theta_n - \left[K_1\theta_n + K_2\theta_n^3 - \frac{V_{sc}(\theta)}{V_{cc}(\theta)}\right]/(K_1 + 3K_2\theta_n^2);$$

if the angle interval corresponding to the scaling compensation sine signal and the scaling compensation cosine signal is (45°, 135°], calculating an iterative electrical angle of the measured magnetic steel according to the following formula:

$$\theta_{n+1} = \theta_n - \left[K_3(\theta_n - \pi) + K_4(\theta_n - \pi)^3 - \frac{V_{sc}(\theta)}{V_{cc}(\theta)}\right]/[K_3 + 3K_4(\theta_n - \pi)^2];$$

if the angle interval corresponding to the scaling compensation sine signal and the scaling compensation cosine signal is (135°, 225°], calculating an iterative electrical angle of the measured magnetic steel according to the following formula:

$$\theta_{n+1} = \theta_n - \left[L_1 + L_2(\theta_n - \pi/2) + L_3(\theta_n - \pi/2)^2 - \frac{V_{cc}(\theta)}{V_{sc}(\theta)}\right]/[L_2 + 2L_3(\theta_n - \pi/2)];$$

if the angle interval corresponding to the scaling compensation sine signal and the scaling compensation cosine signal is (225°, 315°], calculating an iterative electrical angle of the measured magnetic steel according to the following formula:

$$\theta_{n+1} = \theta_n - \left[L_4 + L_5(\theta_n - 3\pi/2) + L_6(\theta_n - 3\pi/2)^2 - \frac{V_{cc}(\theta)}{V_{sc}(\theta)}\right]/[L_5 + 2L_6(\theta_n - 3\pi/2)];$$

Win response to a determination that the relative electrical angle or a number of iterations conforms to a preset iteration rule, setting the iterative electrical angle $\theta_{n+1}$ as the relative electrical angle of the measured magnetic steel; and θ is the relative electrical angle of the measured magnetic steel calculated at the $n^{th}$ iteration; $\theta_{n+1}$ is the relative electrical angle of the measured magnetic steel calculated at the $(n+1)^{th}$ iteration, $V_{sc}(\theta)$ is the scaling compensation sine signal, $V_{cc}(\theta)$ is the scaling compensation cosine signal; K1, K2, K3, K4, L1, L2, L3, L4, L5, and L6 are preset constants.

Optionally, the operation of "in response to a determination that the relative electrical angle or a number of iterations conforms to a preset iteration rule, setting the iterative electrical angle $\theta_{n+1}$ as the relative electrical angle of the measured magnetic steel" includes:

determining whether a difference between the iterative electrical angle $\theta_{n+1}$ and the iterative electrical angle $\theta_n$ is less than a first preset threshold; and setting the iterative electrical angle $\theta_{n+1}$ as the relative electrical angle of the measured magnetic steel, if the difference between the iterative electrical angle $\theta_{n+1}$ and the iterative electrical angle $\theta_n$ is less than the first preset threshold.

Optionally, the operation of "in response to a determination that the relative electrical angle or a number of iterations conforms to a preset iteration rule, setting the iterative electrical angle $\theta_{n+1}$ as the relative electrical angle of the measured magnetic steel" includes:

determining whether the number of iterations n+1 is equal to a second preset threshold; and setting the iterative electrical angle $\theta_{n+1}$ as the relative electrical angle of the measured magnetic steel, if the number of iterations is equal to the second preset threshold.

Optionally, the operation of "calculating the absolute electrical angle according to the relative electrical angle and the polarity position" includes:

calculating the absolute electrical angle according to a first angle calculation formula, if the polarity position of the magnetic steel facing the magnetic encoder is N;

calculating the absolute electrical angle according to a second angle calculation formula, if the polarity position of the magnetic steel facing the magnetic encoder is S; and the first angle calculation formula is: $\theta=\theta_c/2$, the second angle calculation formula is: $\theta=\theta_c/2+180°$, $\theta$ is the absolute electrical angle, and $\theta_c$ is the relative electrical angle.

The present disclosure further provides a system for detecting an absolute electrical angle, including a magnetic encoder and a control device. The magnetic encoder includes a magnetoresistive sensor for detecting a magnetic component in a first direction, and a Hall sensor for detecting a magnetic component in a second direction and a polarity position, or the magnetic encoder includes a magnetoresistive sensor for detecting a magnetic component in a first direction and a magnetic component in a second direction and a Hall sensor for detecting a polarity position. A direction of the magnetic component in the first direction is perpendicular to a direction of the magnetic component in the second direction. The control device includes a processor, a memory, and a program for detecting the absolute electrical angle stored on the memory and executable by the processor, when the program for detecting the absolute electrical angle is executed by the processor, the operations of the method for detecting the absolute electrical angle as described above are implemented.

The present disclosure further provides a computer readable storage medium. The computer readable storage medium stores a program for detecting an absolute electrical angle, when the program for detecting the absolute electrical angle is executed by a processor, the operations of the method for detecting the absolute electrical angle as described above are implemented.

In the technical solutions of the present disclosure, the signal detected by the magnetic encoder is corrected through the scaling compensation formula to avoid the effects of offset errors and ultraharmonics, thereby improving the calculated relative electrical angle and absolute electrical angle. Through the Hall sensor, the N pole or S pole of the measured magnetic steel facing the magnetic encoder can be determined, and the absolute electrical angle of the measured magnetic steel can be calculated.

BRIEF DESCRIPTION OF THE DRAWINGS

In order to more clearly illustrate the embodiments of the present disclosure or the technical solutions in the related art, the drawings used in the embodiments or the related art will be briefly described below. Obviously, the drawings in the following description are only some embodiments of the present disclosure. It will be apparent to those skilled in the art that other figures can be obtained from the structures illustrated in the drawings without the inventive effort.

The realization of the objective, functional characteristics, advantages of the present disclosure are further described with reference to the accompanying drawings.

DETAILED DESCRIPTION OF THE EMBODIMENTS

It should be understood that the specific embodiments described herein are only used to explain the present disclosure and are not intended to limit the present disclosure.

The method for detecting the absolute electrical angle according to an embodiment of the present disclosure is mainly applied to a system for detecting the absolute electrical angle, for detecting the absolute electrical angle of a magnetic steel. The system includes a magnetic encoder, a system controller, and a memory.

Figure 3:
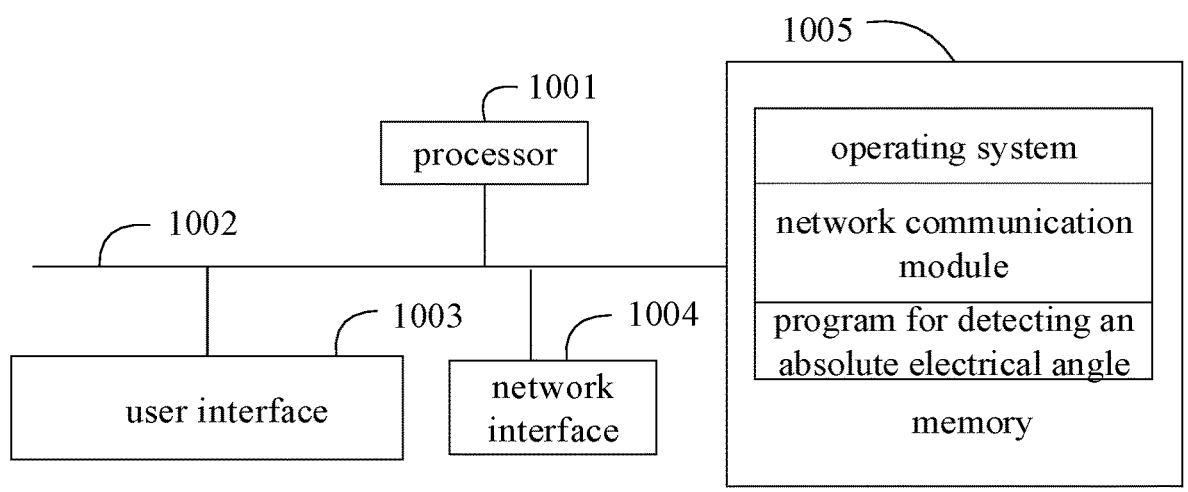
FIG. 3 is a schematic diagram of a hardware structure of a system according to an embodiment of the present disclosure.

Referring to FIG. 3, FIG. 3 is a schematic diagram of a hardware structure of a system according to an embodiment of the present disclosure. In an embodiment of the present disclosure, the controller may include a processor 1001 (such as a CPU), a communication bus 1002, a user interface 1003, a network interface 1004, and a memory 1005. The communication bus 1002 is configured to implement the communication between these components. The user interface 1003 may include a display screen, an input unit such as a keyboard. The network interface 1004 may optionally include a standard wired interface and a wireless interface (such as a WI-FI interface). The memory 1005 may be a high-speed RAM memory or a non-volatile memory, such as a disk memory. The memory 1005 may optionally be a storage device independent of the foregoing processor 1001.

The magnetic encoder includes a magnetoresistive sensor for detecting a magnetic component in a first direction, and a Hall sensor for detecting a magnetic component and a polarity position in a second direction; or the magnetic encoder includes a magnetoresistive sensor for detecting a magnetic component in a first direction and a magnetic component in a second direction and a Hall sensor for detecting a polarity position. A direction of the magnetic component in the first direction is perpendicular to a direction of the magnetic component in the second direction In an embodiment, the magnetic encoder includes a magnetoresistive sensor and a Hall sensor. The magnetoresistive sensor is an MR sensor or an AMR sensor that detects a single direction. The magnetoresistive sensor is a planar component. The number of magnetoresistive sensors is two. One magnetoresistive sensor only measures the magnetic component in one direction, and two magnetoresistive sensors measure two magnetic components in orthogonal directions respectively, so that the magnetic encoder may measure a two-dimensional magnetic field. The direction of the magnetic component detected by the two magnetoresistive sensors can be in the same direction as the tangential and axial directions of the measured magnetic steel, or in the same direction as the radial and tangential directions of the measured magnetic steel, or in the same direction as the radial and axial directions of the measured magnetic steel. In the present embodiment, the magnetic component in the first direction and the magnetic component in the second direction may be a tangential magnetic component and an axial magnetic component of the measured magnetic steel, respectively.

In another embodiment, the magnetic encoder includes a magnetoresistive sensor and a Hall sensor. The magnetoresistive sensor is an MR sensor or an AMR sensor that detects a single direction. The magnetoresistive sensor is a planar component. The number of magnetoresistive sensors is one. One magnetoresistive sensor only measures the magnetic component in one direction, and the magnetoresistive sensor measures two magnetic components in orthogonal directions respectively, so that the magnetic encoder may measure a two-dimensional magnetic field.

In yet another embodiment, the magnetic encoder includes a magnetoresistive sensor and a Hall sensor. The magnetoresistive sensor is an MR sensor or an AMR sensor that detects two orthogonal directions, and the magnetoresistive sensor is a planar component. The number of magnetoresistive sensors is one, so that the magnetic encoder may measure a two-dimensional magnetic field.

Figure 4:
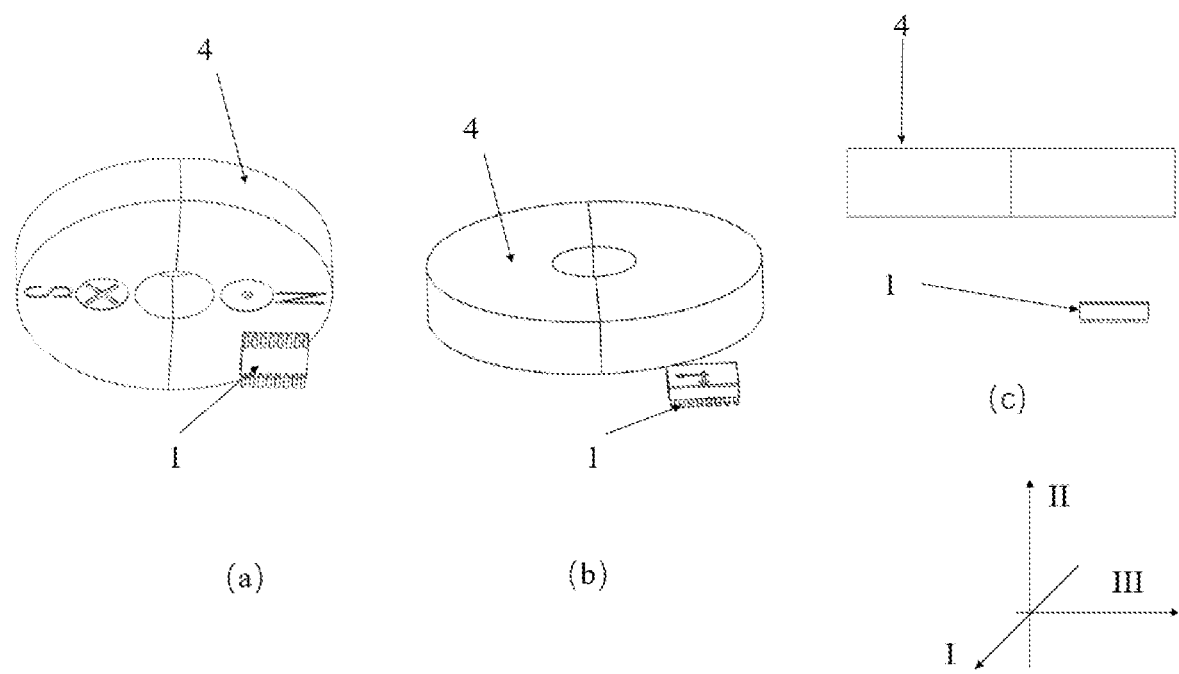
FIG. 4 is a schematic diagram of detection states of a magnetic encoder and a magnetic steel to be measured according to an embodiment of the present disclosure.

Since the number of cycles of the Hall signal generated by the Hall sensor to detect the measured magnetic steel is the same as the number of cycles of the magnetic field of the measured magnetic steel, the Hall signal may be configured to determine whether the polarity position of the measured magnetic steel facing the magnetic encoder is N pole or S pole. As shown in FIG. 4, the position of the magnetic encoder 1 is opposite to the position of the measured magnetic steel 4, in the coordinate system of FIG. 4(*c*), the direction I is tangential, the direction II is axial, and the direction III is radial. The measured magnetic steel 4 is a rotor, and the magnetoresistive sensor may be separated from the Hall sensor, or may be integrally formed with the Hall sensor.

The present disclosure may use a magnetoresistive sensor to detect magnetic components in two directions of the measured magnetic steel 4, and use a signal processing technique to calculate the relative electrical angle of the measured magnetic steel 4; or further use the Hall sensor and signal processing technology to calculate the absolute electrical angle of the measured magnetic steel 4.

In the present disclosure, the magnetic encoder may detect a two-dimensional magnetic field, that is, it may be the tangential-axial magnetic component of the measured magnetic steel, or the radial-tangential magnetic component of the measured magnetic steel, or the radial-axial magnetic component of the measured magnetic steel. For convenience of description, in the following embodiments of the present disclosure, the magnetoresistive sensor is configured to detect the axial-tangential magnetic component as an example for description. Those skilled in the art can understand that, when detecting the radial-tangential magnetic component or the radial-axial magnetic component, only the detection plane of the magnetoresistive sensor and the plane of the measured magnetic component need to be adjusted on the same plane, and the relative position relationship between the Hall sensor and the measured magnetic steel need to be adaptively adjusted. For convenience of description, in the following embodiments of the present disclosure, the tangential magnetic field, the axial magnetic field, and the radial magnetic field all represent the tangential magnetic component distribution, the axial magnetic component distribution, and the radial magnetic component distribution in the magnetic field, rather than independent magnetic fields.

Those skilled in the art can understand that the hardware structure shown in FIG. 3 does not constitute a limitation on the device, and may include more or fewer components than shown, or a combination of some components, or a different component arrangement.

Referring to FIG. 3 again, the memory 1005 as a computer readable storage medium in FIG. 3 may include an operating system, a network communication module, and a program for detecting an absolute electrical angle.

Figure 1:
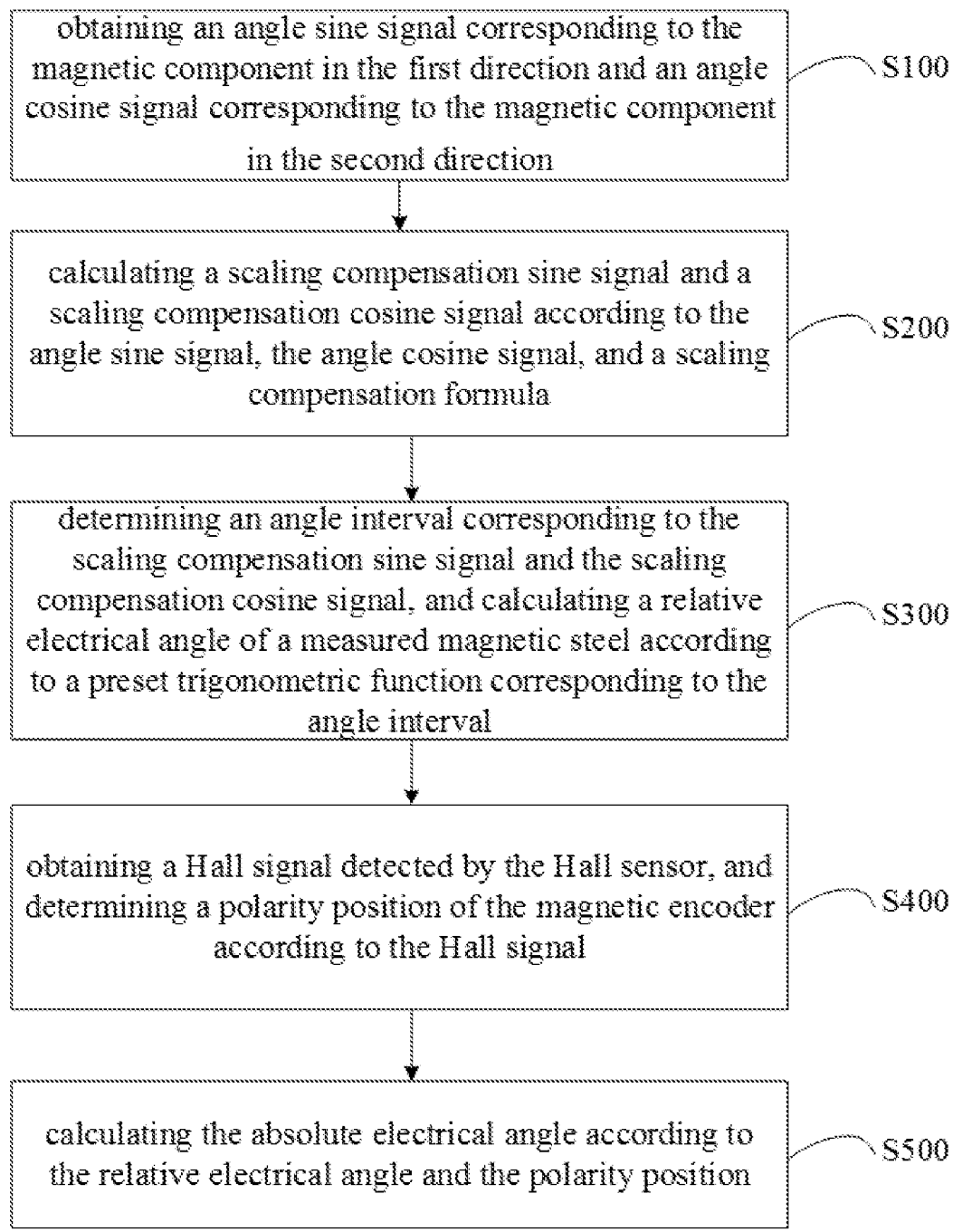
FIG. 1 is a schematic flowchart of a method for detecting an absolute electrical angle according to a first embodiment of the present disclosure.

In FIG. 1, the processor 1001 may call the program for detecting the absolute electrical angle stored on the memory 1005 and perform the following operations:

obtaining an angle sine signal corresponding to the magnetic component in the first direction and an angle cosine signal corresponding to the magnetic component in the second direction;

calculating a scaling compensation sine signal and a scaling compensation cosine signal according to the angle sine signal, the angle cosine signal, and a scaling compensation formula;

determining an angle interval corresponding to the scaling compensation sine signal and the scaling compensation cosine signal, and calculating a relative electrical angle of a measured magnetic steel according to a preset trigonometric function corresponding to the angle interval;

obtaining a Hall signal detected by the Hall sensor, and determining a polarity position of the magnetic encoder according to the Hall signal;

calculating the absolute electrical angle according to the relative electrical angle and the polarity position. The scaling compensation formula is:

$$\begin{cases} V_{sc}(\theta) = [V_s(\theta) - V_{s0}]/V_{s1} \\ V_{cc}(\theta) = [V_c(\theta) - V_{c0}]/V_{c1} \end{cases},$$

$V_{sc}(\theta)$ is the scaling compensation sine signal, $V_{cc}(\theta)$ is the scaling compensation cosine signal, $V_s(\theta)$ is the angle sine signal, $V_c(\theta)$ is the angle cosine signal, $V_{s0}$ is a bias error of a preset sine signal, $V_{c0}$ is a bias error of a preset cosine signal, $V_{s1}$ is a harmonic amplitude compensation of the preset sine signal, $V_{c1}$ is a harmonic amplitude compensation of the preset cosine signal.

Further, the processor 1001 may call the program for detecting the absolute electrical angle stored on the memory 1005 and perform the following operations:

obtaining a periodic voltage signal after the measured magnetic steel rotates for one cycle, the periodic voltage signal comprising a pre-scaling sine signal corresponding to the magnetic component in the first direction and a predetermined scale cosine signal corresponding to the magnetic component in the second direction;

substituting the periodic voltage signal into an offset error calculation formula and a harmonic amplitude compensation calculation formula to obtain an offset voltage and a harmonic amplitude compensation of the voltage signal;

the offset error calculation formula is:

$$V_{s0} = \frac{1}{2N\pi} \int_0^{2N\pi} V_s(\theta) d\theta$$

$$V_{c0} = \frac{1}{2N\pi} \int_0^{2N\pi} V_c(\theta) d\theta,$$

the harmonic amplitude compensation calculation formula is:

$$V_{sn} = \frac{1}{N\pi} \int_0^{2N\pi} V_s(\theta) \cdot \text{Sin}(n\theta) d\theta$$

$$V_{cn} = \frac{1}{N\pi} \int_0^{2N\pi} V_c(\theta) \cdot \text{Cos}(n\theta) \, d\theta;$$

and

N is a number of cycles of the signal, n is $n^{th}$ harmonic, $\theta$ is the relative electrical angle of the measured magnetic steel, $V_{s0}$ is the bias error of the preset sine signal, $V_{c0}$ is the bias error of the preset cosine signal, $V_s(\theta)$ is a pre-scaling sine signal of the periodic voltage signal, $V_c(\theta)$ is a scaling cosine signal of the periodic voltage signal, $V_{sn}$ is a harmonic amplitude compensation of $n^{th}$ preset sine signal, and $V_{cn}$ is a harmonic amplitude compensation of $n^{th}$ preset cosine signal.

Further, the processor 1001 may call the program for detecting the absolute electrical angle stored on the memory 1005 and perform the following operations:

determining an angle interval corresponding to the scaling compensation sine signal and the scaling compensation cosine signal;

if the angle interval corresponding to the scaling compensation sine signal and the scaling compensation cosine signal is −45° to 45° or 135° to 225°, calculating the relative electrical angle of the measured magnetic steel according to the following formula:

$$\theta = \text{Atan}\left[\frac{V_{sc}(\theta)}{V_{cc}(\theta)}\right];$$

if the angle interval corresponding to the scaling compensation sine signal and the scaling compensation cosine signal is −45° to 45°, calculating the relative electrical angle of the measured magnetic steel according to the following formula:

$$\theta = A\text{ctan}\left[\frac{V_{cc}(\theta)}{V_{sc}(\theta)}\right];$$

and $\theta$ is the relative electrical angle of the measured magnetic steel, $V_{sc}(\theta)$ is the scaling compensation sine signal, and $V_{cc}(\theta)$ is the scaling compensation cosine signal.

Further, the processor 1001 may call the program for detecting the absolute electrical angle stored on the memory 1005 and perform the following operations:

determining an angle interval corresponding to the scaling compensation sine signal and the scaling compensation cosine signal;

if the angle interval corresponding to the scaling compensation sine signal and the scaling compensation cosine signal is −45° to 45°, calculating an iterative electrical angle of the measured magnetic steel according to the following formula:

$$\theta_{n+1} = \theta_n - \left[K_1\theta_n + K_2\theta_n^3 - \frac{V_{sc}(\theta)}{V_{cc}(\theta)}\right] \Big/ (K_1 + 3K_2\theta_n^2);$$

if the angle interval corresponding to the scaling compensation sine signal and the scaling compensation cosine signal is −45° to 135°, calculating an iterative electrical angle of the measured magnetic steel according to the following formula:

$$\theta_{n+1} = \theta_n - \left[K_3(\theta_n - \pi) + K_4(\theta_n - \pi)^3 - \frac{V_{sc}(\theta)}{V_{cc}(\theta)}\right] \Big/ [K_3 + 3K_4(\theta_n - \pi)^2];$$

if the angle interval corresponding to the scaling compensation sine signal and the scaling compensation cosine signal is 135° to 225°, calculating an iterative electrical angle of the measured magnetic steel according to the following formula:

$$\theta_{n+1} = \theta_n - \left[L_1 + L_2(\theta_n - \pi/2) + L_3(\theta_n - \pi/2)^2 - \frac{V_{cc}(\theta)}{V_{sc}(\theta)}\right] \Big/ [L_2 + 2L_3(\theta_n - \pi/2)];$$

if the angle interval corresponding to the scaling compensation sine signal and the scaling compensation cosine signal is 225° to 315°, calculating an iterative electrical angle of the measured magnetic steel according to the following formula:

$$\theta_{n+1} = \theta_n - \Big[L_4 + L_5(\theta_n - 3\pi/2) + L_6(\theta_n \cdot 3\pi/2)^2 - \frac{V_{cc}(\theta)}{V_{sc}(\theta)}\Big] \Big/ [L_5 + 2L_6(\theta_n - 3\pi/2)];$$

in response to a determination that the relative electrical angle or a number of iterations conforms to a preset iteration rule, setting the iterative electrical angle $\theta_{n+1}$ as the relative electrical angle of the measured magnetic steel; and $\theta$ is the relative electrical angle of the measured magnetic steel calculated at the $n^{th}$ iteration; $\theta_{n+1}$ is the relative electrical angle of the measured magnetic steel calculated at the $(n+1)^{th}$ iteration, $V_{sc}(\theta)$ is the scaling compensation sine signal, $V_{cc}(\theta)$ is the scaling compensation cosine signal; K1, K2, K3, K4, L1, L2, L3, L4, L5, and L6 are preset constants.

Further, the processor 1001 may call the program for detecting the absolute electrical angle stored on the memory 1005 and perform the following operations:

determining whether a difference between the iterative electrical angle $\theta_{n+1}$ and the iterative electrical angle $\theta_n$ is less than a first preset threshold; and setting the iterative electrical angle $\theta_{n+1}$ as the relative electrical angle of the measured magnetic steel, if the difference between the iterative electrical angle $\theta_{n+1}$ and the iterative electrical angle $\theta_n$ is less than the first preset threshold.

Further, the processor 1001 may call the program for detecting the absolute electrical angle stored on the memory 1005 and perform the following operations:

determining whether the number of iterations n+1 is equal to a second preset threshold; and setting the iterative electrical angle $\theta_{n+1}$ as the relative electrical angle of the measured magnetic steel, if the number of iterations is equal to the second preset threshold.

Further, the processor 1001 may call the program for detecting the absolute electrical angle stored on the memory 1005 and perform the following operations:

calculating the absolute electrical angle according to a first angle calculation formula, if the polarity position of the magnetic steel facing the magnetic encoder is N pole;

calculating the absolute electrical angle according to a second angle calculation formula, if the polarity position of the magnetic steel facing the magnetic encoder is S pole; and the first angle calculation formula is: $\theta=\theta_c/2$, the second angle calculation formula is: $\theta=\theta_c/2+180°$, $\theta$ is the absolute electrical angle, and $\theta_c$ is the relative electrical angle.

The present disclosure provides a method for detecting an absolute electrical angle. Referring to FIG. 1, in a first embodiment of the present disclosure, the method includes the following operations:

Operation S100, obtaining an angle sine signal corresponding to the magnetic component in the first direction and an angle cosine signal corresponding to the magnetic component in the second direction.

Specially, the magnetic encoder is installed in the magnetic field area of the measured magnetic steel, and the magnetic encoder described above is adopted to detect the magnetic field of the measured magnetic steel. The magnetic encoder may output the corresponding voltage signal. The voltage signal includes an angular sine signal corresponding to the magnetic component in the first direction and an angular cosine signal corresponding to the magnetic component in the second direction.

Operation S200, calculating a scaling compensation sine signal and a scaling compensation cosine signal according to the angle sine signal, the angle cosine signal, and a scaling compensation formula. The scaling compensation formula is:

$$\begin{cases} V_{sc}(\theta) = [V_s(\theta) - V_{s0}]/V_{s1} \\ V_{cc}(\theta) = [V_c(\theta) - V_{c0}]/V_{c1} \end{cases}.$$

$V_{sc}(\theta)$ is the scaling compensation sine signal, $V_{cc}(\theta)$ is the scaling compensation cosine signal, $V_s(\theta)$ is the angle sine signal, $V_c(\theta)$ is the angle cosine signal, $V_{s0}$ is a bias error of a preset sine signal, $V_{c0}$ is a bias error of a preset cosine signal, $V_{s1}$ is a harmonic amplitude compensation of the preset sine signal, $V_{c1}$ is a harmonic amplitude compensation of the preset cosine signal.

In fact, when a magnetic encoder is used for detection, the output voltage signal often contains more ultraharmonics, and also contains offset errors caused by the influence of the control circuit. In order to improve the detection accuracy, it is necessary to process the bias error of the magnetic encoder and the ultraharmonics in the output voltage signal. In the present embodiment, the scaling compensation formula is configured to modify the angle sine signal and the angle cosine signal to generate the scaling compensation sine signal and the scaling compensation cosine signal, so as to improve the accuracy of the relative electrical angle and the absolute electrical angle obtained by actuarial calculation. The bias error of the preset sine signal ($V_{s0}$), the bias error of the preset cosine signal ($V_{c0}$), the harmonic amplitude compensation of the preset sine signal ($V_{s1}$), the harmonic amplitude compensation of the preset cosine signal ($V_{c1}$) may be input and stored by a person skilled in the art after the magnetic encoder is powered on for the first time, or may be input by a person skilled in the art every time the magnetic encoder performs detection. In the present disclosure, the harmonic amplitude compensation of the preset sinusoidal signal is represented by $V_{s1}$ and $V_{sn}$. Specially, $V_{s1}$ is the harmonic amplitude compensation of the first harmonic preset sinusoidal signal, and $V_{sn}$ is the harmonic amplitude compensation of the $n^{th}$ harmonic preset sinusoidal signal. Those skilled in the art may similarly preset the harmonic amplitude compensation of the cosine signal.

Operation S300, determining an angle interval corresponding to the scaling compensation sine signal and the scaling compensation cosine signal, and calculating a relative electrical angle of a measured magnetic steel according to a preset trigonometric function corresponding to the angle interval;

Operation S400, obtaining a Hall signal detected by the Hall sensor, and determining a polarity position of the magnetic encoder according to the Hall signal.

Since the number of cycles of the Hall signal generated by the Hall sensor to detect the measured magnetic steel is the same as the number of cycles of the magnetic field of the measured magnetic steel, the Hall signal can be used to determine whether the polarity position of the magnetic steel facing the magnetic encoder is N pole or S pole.

Operation S500, calculating the absolute electrical angle according to the relative electrical angle and the polarity position.

Specially, calculating the absolute electrical angle according to a first angle calculation formula, if the polarity position of the magnetic steel facing the magnetic encoder is N pole;

calculating the absolute electrical angle according to a second angle calculation formula, if the polarity position of the magnetic steel facing the magnetic encoder is S pole.

The first angle calculation formula is: $\theta=\theta_c/2$, the second angle calculation formula is: $\theta=\theta_c/2+180°$, $\theta$ is the absolute electrical angle, and $\theta_c$ is the relative electrical angle.

In the technical solutions of the present disclosure, the signal detected by the magnetic encoder is corrected through the scaling compensation formula to avoid the effects of offset errors and ultraharmonics, thereby improving the calculated relative electrical angle and absolute electrical angle. By setting the Hall sensor, the N pole or S pole of the measured magnetic steel facing the magnetic encoder can be determined, and the absolute electrical angle of the measured magnetic steel can be calculated.

Figure 2:
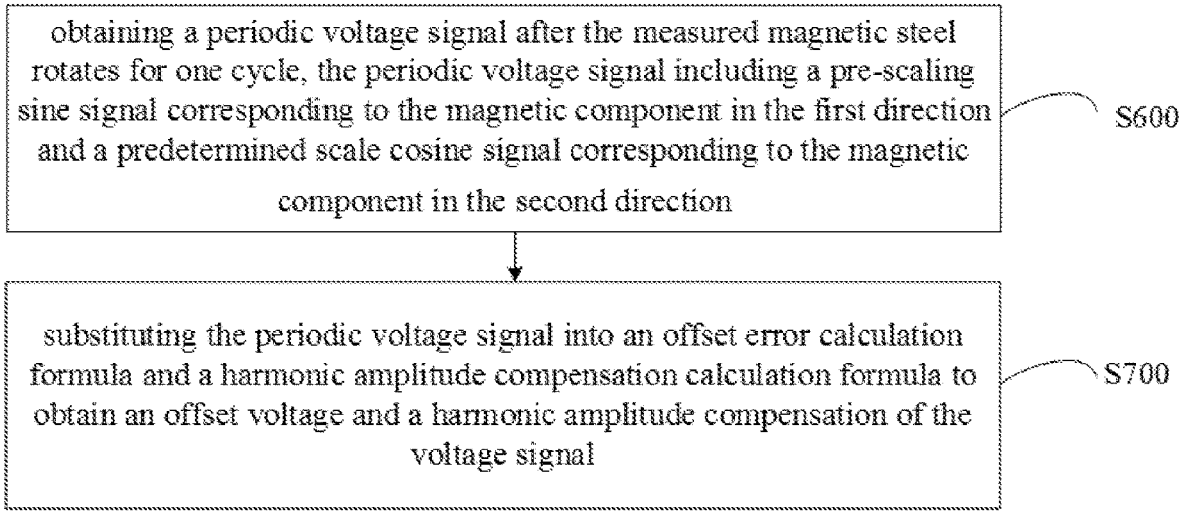
FIG. 2 is a partial schematic flowchart of the method for detecting the absolute electrical angle according to a second embodiment of the present disclosure.

Referring to FIG. 2, FIG. 2 is a partial schematic flowchart of the method for detecting the absolute electrical angle according to a second embodiment of the present disclosure. Based on the above embodiment, before operation S100, the method includes:

Operation S600, obtaining a periodic voltage signal after the measured magnetic steel rotates for one cycle, the periodic voltage signal comprising a pre-scaling sine signal corresponding to the magnetic component in the first direction and a predetermined scale cosine signal corresponding to the magnetic component in the second direction;

Operation S700, substituting the periodic voltage signal into an offset error calculation formula and a harmonic amplitude compensation calculation formula to obtain an offset voltage and a harmonic amplitude compensation of the voltage signal;

the offset error calculation formula is:

$$V_{s0} = \frac{1}{2N\pi}\int_0^{2N\pi} V_s(\theta)\,d\theta$$

$$V_{c0} = \frac{1}{2N\pi}\int_0^{2N\pi} V_c(\theta)\,d\theta,$$

the harmonic amplitude compensation calculation formula is:

$$V_{sn} = \frac{1}{N\pi}\int_0^{2N\pi} V_s(\theta)\cdot\mathrm{Sin}(n\theta)\,d\theta$$

-continued $$V_{cn} = \frac{1}{N\pi} \int_0^{2N\pi} V_c(\theta) \cdot \cos(n\theta) \, d\theta;$$

and

N is a number of cycles of the signal, n is $n^{th}$ harmonic, $\theta$ is the relative electrical angle of the measured magnetic steel, $V_{s0}$ is the bias error of the preset sine signal, $V_{c0}$ is the bias error of the preset cosine signal, $V_s(\theta)$ is a pre-scaling sine signal of the periodic voltage signal, $V_c(\theta)$ is a scaling cosine signal of the periodic voltage signal, $V_{sn}$ is a harmonic amplitude compensation of $n^{th}$ preset sine signal, and $V_{cn}$ is a harmonic amplitude compensation of $n^{th}$ preset cosine signal.

Specially, the measured magnetic steel may be controlled to rotate for one cycle. The magnetic encoder measures the voltage signal of the measured magnetic steel this cycle as a periodic voltage signal, and then substitutes the periodic voltage signal into the offset error calculation formula and the harmonic amplitude compensation calculation formula. The calculated offset error and harmonic amplitude are stored for correction of the signals detected by the subsequent magnetic encoder.

Based on the above embodiment, operation S300 of the method for detecting the absolute electrical angle according to a third embodiment of the present disclosure includes:

determining whether an angle corresponding to the scaling compensation sine signal and the scaling compensation cosine signal is within a preset angle interval, and the preset angle interval is $-45°$ to $45°$ or $135°$ to $225°$;

specially, determining whether an angle corresponding to the scaling compensation sine signal and the scaling compensation cosine signal is within a preset angle intervals $(-45°, 45°)$ or $(135°, 225°)$ through the values of the scaling compensation sine signal $V_{sc}(\theta)$ and the scaling compensation cosine signal $V_{cc}(\theta)$.

if an angle corresponding to the scaling compensation sine signal and the scaling compensation cosine signal is not within the preset angle interval, calculating the relative electrical angle of the measured magnetic steel according to the following formula:

$$\theta = A\tan\left[\frac{V_{sc}(\theta)}{V_{cc}(\theta)}\right];$$

if the angle corresponding to the scaling compensation sine signal and the scaling compensation cosine signal is not within the preset angle interval, calculating the relative electrical angle of the measured magnetic steel according to the following formula:

$$\theta = A\cot\tan\left[\frac{V_{cc}(\theta)}{V_{sc}(\theta)}\right];$$

and $\theta$ is the relative electrical angle of the measured magnetic steel, $V_{sc}(\theta)$ is the scaling compensation sine signal, and $V_{cc}(\theta)$ is the scaling compensation cosine signal.

Further, operation S300 of the method for detecting the absolute electrical angle according to a fourth embodiment of the present disclosure includes:

determining an angle interval corresponding to the scaling compensation sine signal and the scaling compensation cosine signal;

Due to the influence of ultraharmonics, the result of the relative electrical angle calculated by the method provided in the third embodiment will have a large error, and the calculation amount using the inverse trigonometric function is large. The method provided by the present embodiment is adopted to weaken the influence of ultraharmonics and accelerate the calculation speed. The rotation angle of the measured magnetic steel is divided into 4 angle intervals, $(-45°, 45°]$, $(45°, 135°)$, $(135°, 225°]$, and $(225°, 315°)$. Similarly, the value of the scaling compensation sine signal $V_{sc}(\theta)$ and/or the scaling compensation cosine signal $V_{cc}(\theta)$ is used to determine in which the angle interval the angle corresponding to the scaling compensation sine signal and the scaling compensation cosine signal is.

if the angle interval corresponding to the scaling compensation sine signal and the scaling compensation cosine signal is $-45°$ to $45°$, calculating an iterative electrical angle of the measured magnetic steel according to the following formula:

$$\theta_{n+1} = \theta_n - \left[K_1 \theta_n + K_2 \theta_n^3 - \frac{V_{sc}(\theta)}{V_{cc}(\theta)}\right] / (K_1 + 3K_2 \theta_n^2);$$

$K_1$ and $K_2$ are calculated by the following formula:

$$K_1 = \frac{\left(\sum_{n=1}^{\infty} (nV_{sn})\right)}{\left(\sum_{n=1}^{\infty} (V_{cn})\right)};$$

$$K_2 = \frac{1}{6} \frac{\left[3\left(\sum_{n=1}^{\infty} (nV_{sn})\right)\left(\sum_{n=1}^{\infty} (n^2 V_{cn})\right) - \left(\sum_{n=1}^{\infty} (n^2 V_{sn})\right)\left(\sum_{n=1}^{\infty} (nV_{cn})\right)\right]}{\left(\sum_{n=1}^{\infty} (V_{cn})\right)^2};$$

if the angle interval corresponding to the scaling compensation sine signal and the scaling compensation cosine signal is $45°$ to $135°$, calculating an iterative electrical angle of the measured magnetic steel according to the following formula:

$$\theta_{n+1} = \theta_n - \left[K_3(\theta_n - \pi) + K_4(\theta_n - \pi)^3 - \frac{V_{sc}(\theta)}{V_{cc}(\theta)}\right] / [K_3 + 3K_4(\theta_n - \pi)^2];$$

$K_3$ and $K_4$ are calculated by the following formula:

$$K_3 = \frac{\left(\sum_{n=1}^{\infty} [(-1)^n n V_{sn}]\right)}{\left(\sum_{n=1}^{\infty} [(-1)^n V_{cn}]\right)};$$

-continued $$K_4 = \frac{1}{6}\frac{\left\{3\left(\sum_{n=1}^{\infty}[(-1)^n nV_{sn}]\right)\left(\sum_{n=1}^{\infty}[(-1)^n n^2 V_{cn}]\right) - \left(\sum_{n=1}^{\infty}[(-1)^n n^2 V_{sn}]\right)\left(\sum_{n=1}^{\infty}[(-1)^n V_{cn}]\right)\right\}}{\left(\sum_{n=1}^{\infty}[(-1)^n V_{cn}]\right)^2};$$

if the angle interval corresponding to the scaling compensation sine signal and the scaling compensation cosine signal is 135° to 225°, calculating an iterative electrical angle of the measured magnetic steel according to the following formula:

$$\theta_{n+1} = \theta_n - \left[L_1 + L_2(\theta_n - \pi/2) + L_3(\theta_n - \pi/2)^2 - \frac{V_{cc}(\theta)}{V_{sc}(\theta)}\right]/[L_2 + 2L_3(\theta_n - \pi/2)];$$

$L_1$, $L_2$ and $L_3$ are calculated by the following formula:

$$L_1 = \frac{\left(\sum_{n=1}^{\infty}[(-1)^{n+1}V_{c(2n)}]\right)}{\left(\sum_{n=1}^{\infty}[(-1)^n V_{s(2n+1)}]\right)};$$

$$L_2 = -\left\{\left(\sum_{n=1}^{\infty}[(-1)^n V_{s(2n-1)}]\right)\left(\sum_{n=1}^{\infty}[(-1)^n(2n-1)V_{c(2n-1)}]\right)2\left(\sum_{n=1}^{\infty}[(-1)^n nV_{s(2n)}]\right)\right.$$
$$\left.\left(\sum_{n=1}^{\infty}[(-1)^n V_{c(2n)}]\right)\right\}/\left(\sum_{n=1}^{\infty}[(-1)^n V_{s(2n-1)}]\right)^2;$$

$$L_3 = \frac{1}{2\left(\sum_{n=1}^{\infty}[(-1)^n V_{s(2n+1)}]\right)^2}\left[\left\{4\left(\sum_{n=1}^{\infty}[(-1)^{n+1}nV_{s(2n)}]\right)\right.\right.$$
$$\left(\sum_{n=1}^{\infty}[(-1)^n V_{s(2n-1)}]\right)\left(\sum_{n=1}^{\infty}[(-1)^n(2n-1)V_{s(2n-1)}]\right) +$$
$$\left\{\left(\sum_{n=1}^{\infty}[(-1)^n(2n-1)^2 V_{s(2n-1)}]\right)\left(\sum_{n=1}^{\infty}[(-1)^n V_{s(2n-1)}]\right)\right\} +$$
$$8\left(\sum_{n=1}^{\infty}[(-1)^n nV_{s(2n)}]\right)^2\left\{\left(\sum_{n=1}^{\infty}[(-1)^{n+1}V_{c(2n)}]\right)\right\} -$$
$$\left.\left.4\left(\sum_{n=1}^{\infty}[(-1)^n V_{s(2n-1)}]\right)^2\left(\sum_{n=1}^{\infty}[(-1)^{n+1}n^2 V_{c(2n)}]\right)\right]\right];$$

if the angle interval corresponding to the scaling compensation sine signal and the scaling compensation cosine signal is 225° to 315°, calculating an iterative electrical angle of the measured magnetic steel according to the following formula:

$$\theta_{n+1} = \theta_n - \left[L_4 + L_5(\theta_n - 3\pi/2) + L_6(\theta_n - 3\pi/2)^2 - \frac{V_{cc}(\theta)}{V_{sc}(\theta)}\right]/[L_5 + 2L_6(\theta_n - 3\pi/2)];$$

$L_4$, $L_5$ and $L_6$ are calculated by the following formula:

$$L_4 = \frac{\left(\sum_{n=1}^{\infty}[(-1)^n V_{c(2n)}]\right)}{\left(\sum_{n=1}^{\infty}[(-1)^n V_{s(2n+1)}]\right)};$$

$$L_5 = -\left\{\left(\sum_{n=1}^{\infty}[(-1)^n V_{s(2n-1)}]\right)\left(\sum_{n=1}^{\infty}[(-1)^n(2n-1)V_{c(2n-1)}]\right) - 2\left(\sum_{n=1}^{\infty}[(-1)^n nV_{s(2n)}]\right)\left(\sum_{n=1}^{\infty}[(-1)^n V_{c(2n)}]\right)\right\}/\left(\sum_{n=1}^{\infty}[(-1)^n V_{s(2n-1)}]\right)^2;$$

$$L_6 = \frac{1}{2\left(\sum_{n=1}^{\infty}[(-1)^n V_{s(2n-1)}]\right)^2}\left[\left\{4\left(\sum_{n=1}^{\infty}[(-1)^{n+1}V_{s(2n-1)}]\right)\right.\right.$$
$$\left(\sum_{n=1}^{\infty}[(-1)^n nV_{s(2n)}]\right)\left(\sum_{n=1}^{\infty}[(-1)^n(2n-1)V_{c(2n-1)}]\right) -$$
$$\left\{\left(\sum_{n=1}^{\infty}[(-1)^n(2n-1)^2 V_{s(2n-1)}]\right)\left(\sum_{n=1}^{\infty}[(-1)^n V_{s(2n-1)}]\right)\right\} +$$
$$8\left(\sum_{n=1}^{\infty}[(-1)^n nV_{s(2n)}]\right)^2\left\{\left(\sum_{n=1}^{\infty}[(-1)^{n+1}V_{c(2n)}]\right)\right\} +$$
$$\left.\left.4\left(\sum_{n=1}^{\infty}[(-1)^n V_{s(2n-1)}]\right)^2\left(\sum_{n=1}^{\infty}[(-1)^{n+1}n^2 V_{c(2n)}]\right)\right]\right];$$

in response to a determination that the relative electrical angle or a number of iterations conforms to a preset iteration rule, setting the iterative electrical angle $\theta_{n+1}$ as the relative electrical angle of the measured magnetic steel; and $\theta$ is the relative electrical angle of the measured magnetic steel calculated at the $n^{th}$ iteration; $\theta_{n+1}$ is the relative electrical angle of the measured magnetic steel calculated at the $(n+1)^{th}$ iteration, $V_{sc}(\theta)$ is the scaling compensation sine signal, $V_{cc}(\theta)$ is the scaling compensation cosine signal; K1, K2, K3, K4, L1, L2, L3, L4, L5, and L6 are preset constants.

In the present embodiment, by setting 4 different angle intervals, and using the corresponding iterative formula to calculate the relative electrical angle, the influence of ultra-harmonics can be reduced, and the use of inverse trigonometric functions can be reduced to increase the calculation speed.

Based on the above embodiment, in the method for detecting the absolute electrical angle according to a fifth embodiment of the present disclosure, the operation of "in response to a determination that the relative electrical angle or a number of iterations conforms to a preset iteration rule, setting the iterative electrical angle $\theta_{n+1}$ as the relative electrical angle of the measured magnetic steel" includes:

determining whether a difference between the iterative electrical angle $\theta_{n+1}$ and the iterative electrical angle $\theta_n$ is less than a first preset threshold; and setting the iterative electrical angle $\theta_{n+1}$ as the relative electrical angle of the measured magnetic steel, if the difference between the iterative electrical angle $\theta_{n+1}$ and the iterative electrical angle $\theta_n$ is less than the first preset threshold.

In the method for detecting the absolute electrical angle according to a sixth embodiment of the present disclosure, the operation of "in response to a determination that the relative electrical angle or a number of iterations conforms to a preset iteration rule, setting the iterative electrical angle $\theta_{n+1}$ as the relative electrical angle of the measured magnetic steel" includes:

determining whether the number of iterations n+1 is equal to a second preset threshold; and setting the iterative electrical angle $\theta_{n+1}$ as the relative electrical angle of the measured magnetic steel, if the number of iterations is equal to the second preset threshold.

In the fifth embodiment, the first preset threshold is set to determine whether the error of the iterative electrical angle value calculated by two adjacent iterations is within a preset range, thereby controlling whether the iteration continues. In the sixth embodiment, a second preset threshold value is set to determine whether the total number of iterations reaches the preset number of times, thereby controlling whether the iteration continues. Those skilled in the art can set the first preset threshold and the second preset threshold by themselves according to actual needs, and can use any of the methods in the fifth embodiment and the sixth embodiment to decide whether to continue the iteration.

Besides, the present disclosure further provides a computer readable storage medium.

The computer readable storage medium of the present disclosure stores a program for detecting an absolute electrical angle. When the program is executed by a processor, the operations of the method for detecting the absolute electrical angle described above are implemented. The method implemented when the program is executed may refer to various embodiments of the method for detecting the absolute electrical angle of the present disclosure, and details are not described herein again.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware. Moreover, the present disclosure may take the form of a computer program product implemented on one or more computer usable storage medium (including, but not limited to, disk memory, CD-ROM, optical memory, etc.) containing computer-usable program code.

The present disclosure is described with reference to flowcharts and/or block diagrams of methods, devices (systems), and computer program products according to embodiments of the present disclosure. It should be understood that each flowchart and/or block in the flowcharts and/or block diagrams, and combinations of flowchart and/or block in the flowcharts and/or block diagrams can be implemented by computer program instructions. These computer program instructions may be provided to a processor of a general purpose computer, special purpose computer, embedded processor, or other programmable data processing device to produce a machine, such that the instructions that are executed by a processor of a computer or other programmable data processing device cause means for implementing the functions specified in one or more flowcharts of the flowchart diagrams and/or one or more blocks of the block diagrams.

These computer program instructions may also be stored on a computer readable memory that can direct a computer or other programmable data processing device to work in a particular manner, such that the instructions stored on the computer readable memory are caused to produce an article of manufacture that includes instruction means that implement the functions specified in one or more flowcharts of the flowchart diagrams and/or one or more blocks of the block diagrams.

These computer program instructions can also be loaded onto a computer or other programmable data processing device, so that a series of operations can be performed on the computer or other programmable device to produce a computer-implemented process, thus the instructions executed on a computer or other programmable device provide operations for implementing the functions specified in one or more flowcharts of the flowchart diagrams and/or one or more blocks of the block diagrams.

It should be noted that in the claims, any reference signs placed between parentheses shall not be construed as limiting the claim. The word "comprising" does not exclude the presence of elements or operations not listed in a claim. The word "a" or "an" preceding a part does not exclude the presence of a plurality of such parts. The present disclosure can be implemented by means of hardware including several distinct parts, and by means of a suitably programmed computer. In the unit claim listing several devices, several of these devices may be embodied by the same hardware item. The use of the words first, second, and third does not imply any order. These words can be interpreted as names.

Although the preferred embodiments of the present disclosure have been described, those skilled in the art can make other changes and modifications to these embodiments once they know the basic inventive concepts. Therefore, the appended claims are intended to be construed to include the preferred embodiments and all changes and modifications that fall within the scope of the disclosure.

The above are only preferred embodiments of the present disclosure, and thus do not limit the scope of the present disclosure. Under the concept of the present disclosure, the equivalent structural transformations made by the present specification and the drawings are directly or indirectly applied to other related technical fields, and are included in the scope of the present disclosure.

What is claimed is:

1. A method for detecting an absolute electrical angle of a magnetic encoder, wherein:

the magnetic encoder comprises a magnetoresistive sensor for detecting a magnetic component in a first direction, and a Hall sensor for detecting a magnetic component in a second direction and a polarity position, or the magnetic encoder comprises a magnetoresistive sensor for detecting a magnetic component in a first direction and a magnetic component in a second direction and a Hall sensor for detecting a polarity position, a direction of the magnetic component in the first direction is perpendicular to a direction of the magnetic component in the second direction; the method for detecting the absolute electrical angle comprises:

obtaining an angle sine signal corresponding to the magnetic component in the first direction and an angle cosine signal corresponding to the magnetic component in the second direction;

calculating a scaling compensation sine signal and a scaling compensation cosine signal according to the angle sine signal, the angle cosine signal, and a scaling compensation formula;

determining an angle interval corresponding to the scaling compensation sine signal and the scaling compensation cosine signal, and calculating a relative electrical angle of a measured magnetic steel according to a preset trigonometric function corresponding to the angle interval;

obtaining a Hall signal detected by the Hall sensor, and determining a polarity position of the magnetic encoder according to the Hall signal; and calculating the absolute electrical angle according to the relative electrical angle and the polarity position;

wherein the scaling compensation formula is:

$$\begin{cases} V_{sc}(\theta) = [V_s(\theta) - V_{s0}]/V_{s1} \\ V_{cc}(\theta) = [V_c(\theta) - V_{c0}]/V_{c1} \end{cases}, V_{sc}(\theta)$$

is the scaling compensation sine signal, $V_{cc}(\theta)$ is the scaling compensation cosine signal, $V_s(\theta)$ is the angle sine signal, $V_c(\theta)$ is the angle cosine signal, $V_{s0}$ is a bias error of a preset sine signal, $V_{c0}$ is a bias error of a preset cosine signal, $V_{s1}$ is a harmonic amplitude compensation of the preset sine signal, $V_{c1}$ is a harmonic amplitude compensation of the preset cosine signal.

2. The method of claim 1, wherein the operation of "calculating the absolute electrical angle according to the relative electrical angle and the polarity position" comprises:

calculating the absolute electrical angle according to a first angle calculation formula, if the polarity position of the magnetic steel facing the magnetic encoder is N pole;

calculating the absolute electrical angle according to a second angle calculation formula, if the polarity position of the magnetic steel facing the magnetic encoder is S pole;

wherein the first angle calculation formula is: $\theta = \theta_c/2$, the second angle calculation formula is: $\theta = \theta_c/2 + 180°$, $\theta$ is the absolute electrical angle, and $\theta_c$ is the relative electrical angle.

3. The method of claim 1, wherein the operation of "obtaining an angle sine signal corresponding to the magnetic component in the first direction and an angle cosine signal corresponding to the magnetic component in the second direction" comprises:

obtaining a periodic voltage signal after the measured magnetic steel rotates for one cycle, the periodic voltage signal comprising a pre-scaling sine signal corresponding to the magnetic component in the first direction and a predetermined scale cosine signal corresponding to the magnetic component in the second direction;

substituting the periodic voltage signal into an offset error calculation formula and a harmonic amplitude compensation calculation formula to obtain an offset voltage and a harmonic amplitude compensation of the voltage signal; wherein:

the offset error calculation formula is:

$$V_{s0} = \frac{1}{2N\pi} \int_0^{2N\pi} V_s(\theta) d\theta$$

$$V_{c0} = \frac{1}{2N\pi} \int_0^{2N\pi} V_c(\theta) d\theta,$$

the harmonic amplitude compensation calculation formula is:

$$V_{sn} = \frac{1}{N\pi} \int_0^{2N\pi} V_s(\theta) \cdot \operatorname{Sin}(n\theta) d\theta$$

$$V_{cn} = \frac{1}{N\pi} \int_0^{2N\pi} V_c(\theta) \cdot \operatorname{Cos}(n\theta) d\theta;$$

and

N is a number of cycles of the signal, n is $n^{th}$ harmonic, $\theta$ is the relative electrical angle of the measured magnetic steel, $V_{s0}$ is the bias error of the preset sine signal, $V_{c0}$ is the bias error of the preset cosine signal, $V_s(\theta)$ is a pre-scaling sine signal of the periodic voltage signal, $V_c(\theta)$ is a scaling cosine signal of the periodic voltage signal, $V_{sn}$ is a harmonic amplitude compensation of $n^{th}$ preset sine signal, and $V_{cn}$ is a harmonic amplitude compensation of $n^{th}$ preset cosine signal.

4. The method of claim 3, wherein the operation of "determining an angle interval corresponding to the scaling compensation sine signal and the scaling compensation cosine signal, and calculating a relative electrical angle of a measured magnetic steel according to a preset trigonometric function corresponding to the angle interval" comprises:

determining whether an angle corresponding to the scaling compensation sine signal and the scaling compensation cosine signal is within a preset angle interval, and the preset angle interval is −45° to 45° or 135° to 225°;

if the angle corresponding to the scaling compensation sine signal and the scaling compensation cosine signal is within the preset angle interval, calculating the relative electrical angle of the measured magnetic steel according to the following formula:

$$\theta = \operatorname{Atan}\left[\frac{V_{sc}(\theta)}{V_{cc}(\theta)}\right];$$

if the angle corresponding to the scaling compensation sine signal and the scaling compensation cosine signal is not within the preset angle interval, calculating the relative electrical angle of the measured magnetic steel according to the following formula:

$$\theta = A c t a n\left[\frac{V_{cc}(\theta)}{V_{sc}(\theta)}\right];$$

wherein $\theta$ is the relative electrical angle of the measured magnetic steel, $V_{sc}(\theta)$ is the scaling compensation sine signal, and $V_{cc}(\theta)$ is the scaling compensation cosine signal.

5. The method of claim 3, wherein the operation of "determining an angle interval corresponding to the scaling compensation sine signal and the scaling compensation cosine signal, and calculating a relative electrical angle of a measured magnetic steel according to a preset trigonometric function corresponding to the angle interval" comprises:

determining the angle interval corresponding to the scaling compensation sine signal and the scaling compensation cosine signal;

if the angle interval corresponding to the scaling compensation sine signal and the scaling compensation cosine signal is (−45°, 45°], calculating an iterative electrical angle of the measured magnetic steel according to the following formula:

$$\theta_{n+1} = \theta_n - \left[K_1\theta_n + K_2\theta_n^3 - \frac{V_{sc}(\theta)}{V_{cc}(\theta)}\right] / (K_1 + 3K_2\theta_n^2);$$

if the angle interval corresponding to the scaling compensation sine signal and the scaling compensation cosine signal is (45°, 135°], calculating an iterative electrical angle of the measured magnetic steel according to the following formula:

$$\theta_{n+1} = \theta_n - \left[K_3(\theta_n - \pi) + K_4(\theta_n - \pi)^3 - \frac{V_{sc}(\theta)}{V_{cc}(\theta)}\right] / [K_3 + 3K_4(\theta_n - \pi)^2];$$

if the angle interval corresponding to the scaling compensation sine signal and the scaling compensation cosine signal is (135°, 225°], calculating an iterative electrical angle of the measured magnetic steel according to the following formula:

$$\theta_{n+1} = \theta_n - \left[L_1 + L_2(\theta_n - \pi/2) + L_3(\theta_n - \pi/2)^2 - \frac{V_{cc}(\theta)}{V_{sc}(\theta)}\right] / [L_2 + 2L_3(\theta_n - \pi/2)];$$

if the angle interval corresponding to the scaling compensation sine signal and the scaling compensation cosine signal is (225°, 315°], calculating an iterative electrical angle of the measured magnetic steel according to the following formula:

$$\theta_{n+1} = \theta_n - \left[L_4 + L_5(\theta_n - 3\pi/2) + L_6(\theta_n - 3\pi/2)^2 - \frac{V_{cc}(\theta)}{V_{sc}(\theta)}\right] / [L_5 + 2L_6(\theta_n - 3\pi/2)];$$

in response to a determination that the relative electrical angle or a number of iterations conforms to a preset iteration rule, setting the iterative electrical angle $\theta_{n+1}$ as the relative electrical angle of the measured magnetic steel;

wherein $\theta$ is the relative electrical angle of the measured magnetic steel calculated at the $n^{th}$ iteration; $\theta_{n+1}$ is the relative electrical angle of the measured magnetic steel calculated at the $(n+1)^{th}$ iteration, $V_{sc}(\theta)$ is the scaling compensation sine signal, $V_{cc}(\theta)$ is the scaling compensation cosine signal; K1, K2, K3, K4, L1, L2, L3, L4, L5, and L6 are preset constants.

6. The method of claim 5, wherein the preset constants K1, K2, K3, K4, L1, L2, L3, L4, L5, and L6 are calculated by the following formulas:

$$K_1 = \frac{\left(\sum_{n=1}^{\infty}(nV_{sn})\right)}{\left(\sum_{n=1}^{\infty}(V_{cn})\right)};$$

$$K_2 = \frac{1}{6}\frac{\left[3\left(\sum_{n=1}^{\infty}(nV_{sn})\right)\left(\sum_{n=1}^{\infty}(n^2 V_{cn})\right) - \left(\sum_{n=1}^{\infty}(n^2 V_{sn})\right)\left(\sum_{n=1}^{\infty}(V_{cn})\right)\right]}{\left(\sum_{n=1}^{\infty}(V_{cn})\right)^2};$$

$$K_3 = \frac{\left(\sum_{n=1}^{\infty}[(-1)^n nV_{sn}]\right)}{\left(\sum_{n=1}^{\infty}[(-1)^n V_{cn}]\right)};$$

$$K_4 = \frac{1}{6}\frac{\left\{3\left(\sum_{n=1}^{\infty}[(-1)^n nV_{sn}]\right)\left(\sum_{n=1}^{\infty}[(-1)^n n^2 V_{cn}]\right) - \left(\sum_{n=1}^{\infty}[(-1)^n n^2 V_{sn}]\right)\left(\sum_{n=1}^{\infty}[(-1)^n V_{cn}]\right)\right\}}{\left(\sum_{n=1}^{\infty}[(-1)^n V_{cn}]\right)^2};$$

$$L_1 = \frac{\left(\sum_{n=1}^{\infty}[(-1)^{n+1}V_{c(2n)}]\right)}{\left(\sum_{n=1}^{\infty}[(-1)^n V_{s(2n+1)}]\right)};$$

$$L_2 = -\left\{\left(\sum_{n=1}^{\infty}[(-1)^n V_{s(2n-1)}]\right)\left(\sum_{n=1}^{\infty}[(-1)^n (2n-1)V_{c(2n-1)}]\right) 2\left(\sum_{n=1}^{\infty}[(-1)^n nV_{s(2n)}]\right)\right.$$
$$\left.\left(\sum_{n=1}^{\infty}[(-1)^n V_{c(2n)}]\right)\right\} / \left(\sum_{n=1}^{\infty}[(-1)^n V_{s(2n-1)}]\right)^2;$$

$$L_3 = \frac{1}{2\left(\sum_{n=1}^{\infty}[(-1)^n V_{s(2n+1)}]\right)^3}\left[\left\{4\left(\sum_{n=1}^{\infty}[(-1)^{n+1}nV_{s(2n)}]\right)\right.\right.$$
$$\left(\sum_{n=1}^{\infty}[(-1)^n V_{s(2n-1)}]\right)\left(\sum_{n=1}^{\infty}[(-1)^n(2n-1)V_{s(2n-1)}]\right) +$$
$$\left\{\left(\sum_{n=1}^{\infty}[(-1)^n(2n-1)^2 V_{s(2n-1)}]\right)\left(\sum_{n=1}^{\infty}[(-1)^n V_{s(2n-1)}]\right) + \right.$$
$$8\left(\sum_{n=1}^{\infty}[(-1)^n nV_{s(2n)}]\right)^2\right\}\left(\sum_{n=1}^{\infty}[(-1)^{n+1}V_{c(2n)}]\right)$$
$$\left.\left.4\left(\sum_{n=1}^{\infty}[(-1)^n V_{s(2n-1)}]\right)^2\left(\sum_{n=1}^{\infty}[(-1)^{n+1}n^2 V_{c(2n)}]\right)\right\}\right];$$

$$L_4 = \frac{\left(\sum_{n=1}^{\infty}[(-1)^n V_{c(2n)}]\right)}{\left(\sum_{n=1}^{\infty}[(-1)^n V_{s(2n+1)}]\right)};$$

$$L_5 = -\left\{\left(\sum_{n=1}^{\infty}[(-1)^n V_{s(2n-1)}]\right)\left(\sum_{n=1}^{\infty}[(-1)^n(2n-1)V_{c(2n-1)}]\right) - \right.$$
$$\left.2\left(\sum_{n=1}^{\infty}[(-1)^n nV_{s(2n)}]\right)\left(\sum_{n=1}^{\infty}[(-1)^n V_{c(2n)}]\right)\right\}$$
$$\left(\sum_{n=1}^{\infty}[(-1)^n V_{s(2n-1)}]\right)^2;$$

-continued $$L_6 = \frac{1}{2\left(\sum_{n=1}^{\infty}[(-1)^n V_{s(2n-1)}]\right)^3}\left[\left\{4\left(\sum_{n=1}^{\infty}[(-1)^{n+1} V_{s(2n-1)}]\right)\right.\right.$$

$$\left(\sum_{n=1}^{\infty}[(-1)^n n V_{s(2n)}]\right)\left(\sum_{n=1}^{\infty}[(-1)^n (2n-1)V_{c(2n-1)}]\right) -$$

$$\left\{\left(\sum_{n=1}^{\infty}[(-1)^n (2n-1)^2 V_{s(2n-1)}]\right)\left(\sum_{n=1}^{\infty}[(-1)^n V_{s(2n-1)}]\right) +$$

$$8\left(\sum_{n=1}^{\infty}[(-1)^n n V_{s(2n)}]\right)^2\right\}\left(\sum_{n=1}^{\infty}[(-1)^{n+1} V_{c(2n)}]\right) +$$

$$\left.4\left(\sum_{n=1}^{\infty}[(-1)^n V_{s(2n-1)}]\right)^2\left(\sum_{n=1}^{\infty}[(-1)^{n+1} n^2 V_{c(2n)}]\right)\right].$$

7. The method of claim 5, wherein the operation of "in response to a determination that the relative electrical angle or a number of iterations conforms to a preset iteration rule, setting the iterative electrical angle $\theta_{n+1}$ as the relative electrical angle of the measured magnetic steel" comprises:
determining whether a difference between the iterative electrical angle $\theta_{n+1}$ and the iterative electrical angle $\theta_n$ is less than a first preset threshold; and
setting the iterative electrical angle $\theta_{n+1}$ as the relative electrical angle of the measured magnetic steel, if the difference between the iterative electrical angle $\theta_{n+1}$ and the iterative electrical angle $\theta_n$ is less than the first preset threshold.

8. The method of claim 5, wherein the operation of "in response to a determination that the relative electrical angle or a number of iterations conforms to a preset iteration rule, setting the iterative electrical angle $\theta_{n+1}$ as the relative electrical angle of the measured magnetic steel" comprises:
determining whether the number of iterations n+1 is equal to a second preset threshold; and
setting the iterative electrical angle $\theta_{n+1}$ as the relative electrical angle of the measured magnetic steel, if the number of iterations is equal to the second preset threshold.

9. A system for detecting an absolute electrical angle, comprising a magnetic encoder and a control device, wherein:
the magnetic encoder comprises a magnetoresistive sensor for detecting a magnetic component in a first direction, and a Hall sensor for detecting a magnetic component in a second direction and a polarity position, or
the magnetic encoder comprises a magnetoresistive sensor for detecting a magnetic component in a first direction and a magnetic component in a second direction and a Hall sensor for detecting a polarity position,
a direction of the magnetic component in the first direction is perpendicular to a direction of the magnetic component in the second direction;
the control device comprises a processor, a memory, and a program for detecting the absolute electrical angle stored on the memory and executable by the processor, when the program for detecting the absolute electrical angle is executed by the processor, the operations of the method for detecting the absolute electrical angle of claim 1 are implemented.

10. A computer readable storage medium, wherein the computer readable storage medium stores a program for detecting an absolute electrical angle, when the program for detecting the absolute electrical angle is executed by a processor, the operations of the method for detecting the absolute electrical angle of claim 1 are implemented.

* * * * *